US009893152B2

(12) United States Patent
Chen et al.

(10) Patent No.: US 9,893,152 B2
(45) Date of Patent: Feb. 13, 2018

(54) SEMI-INSULATING SILICON CARBIDE MONOCRYSTAL AND METHOD OF GROWING THE SAME

(75) Inventors: Xiaolong Chen, Beijing (CN); Chunjun Liu, Beijing (CN); Tonghua Peng, Beijing (CN); Longyuan Li, Beijing (CN); Bo Wang, Beijing (CN); Gang Wang, Beijing (CN); Wenjun Wang, Beijing (CN); Yu Liu, Beijing (CN)

(73) Assignee: Institute of Physics, Chinese Academy of Sciences, Beijing (CN)

( * ) Notice: Subject to any disclaimer, the term of this patent is extended or adjusted under 35 U.S.C. 154(b) by 711 days.

(21) Appl. No.: 13/976,351

(22) PCT Filed: Dec. 6, 2011

(86) PCT No.: PCT/CN2011/083503
§ 371 (c)(1),
(2), (4) Date: Aug. 8, 2013

(87) PCT Pub. No.: WO2012/088996
PCT Pub. Date: Jul. 5, 2012

(65) Prior Publication Data
US 2013/0313575 A1    Nov. 28, 2013

(30) Foreign Application Priority Data
Dec. 31, 2010 (CN) .......................... 2010 1 0617348

(51) Int. Cl.
*H01L 29/16* (2006.01)
*C30B 23/00* (2006.01)
(Continued)

(52) U.S. Cl.
CPC .......... *H01L 29/1608* (2013.01); *C30B 23/00* (2013.01); *C30B 23/002* (2013.01);
(Continued)

(58) Field of Classification Search
CPC ... H01L 29/1608; H01L 29/435; C30B 23/00; C30B 23/002; C30B 23/005; C30B 23/06; C30B 29/36
See application file for complete search history.

(56) References Cited

U.S. PATENT DOCUMENTS 7,767,022 B1    8/2010  Gupta et al.
2003/0079676 A1*  5/2003  Ellison et al. .................. 117/88
(Continued)

FOREIGN PATENT DOCUMENTS

CN    1351680 A    5/2002
CN    1507506 A    6/2004
(Continued)

OTHER PUBLICATIONS

Dmitriev et al. ("Status of SiC Technology: Bulk and epitaxial Growth"), TTEC Panel Report on high Temperature Electronics in Europe, Chapter 2, pp. 5-18, 2000.*
(Continued)

*Primary Examiner* — Jonathan Langman
(74) *Attorney, Agent, or Firm* — Knobbe, Martens, Olson & Bear, LLP

(57) ABSTRACT

A semi-insulating silicon carbide monocrystal and a method of growing the same are disclosed. The semi-insulating silicon carbide monocrystal comprises intrinsic impurities, deep energy level dopants and intrinsic point defects. The intrinsic impurities are introduced unintentionally during manufacture of the silicon carbide monocrystal, and the deep energy level dopants and the intrinsic point defects are doped or introduced intentionally to compensate for the intrinsic impurities. The intrinsic impurities include shallow energy level donor impurities and shallow energy level acceptor impurities. A sum of a concentration of the deep energy level dopants and a concentration of the intrinsic point defects is greater than a difference between a concen-
(Continued)

tration of the shallow energy level donor impurities and a concentration of the shallow energy level acceptor impurities, and the concentration of the intrinsic point defects is less than the concentration of the deep energy level dopants. The semi-insulating SiC monocrystal has resistivity greater than $1\times10^5$ Ω·cm at room temperature, and its electrical performances and crystal quality satisfy requirements for manufacture of microwave devices. The deep energy level dopants and the intrinsic point defects jointly serve to compensate the intrinsic impurities, so as to obtain a high quality semi-insulating single crystal.

20 Claims, 4 Drawing Sheets

(51) Int. Cl.
*H01L 29/43* (2006.01)
*C30B 23/06* (2006.01)
*C30B 29/36* (2006.01)
*H01L 21/02* (2006.01)

(52) U.S. Cl.
CPC ............ *C30B 23/005* (2013.01); *C30B 23/06* (2013.01); *C30B 29/36* (2013.01); *H01L 21/02529* (2013.01); *H01L 29/435* (2013.01)

(56) References Cited

U.S. PATENT DOCUMENTS

| 2006/0075958 | A1 | 4/2006 | Powell et al. | |
| 2006/0137600 | A1* | 6/2006 | Ellison | C30B 25/00 117/19 |
| 2006/0174825 | A1 | 8/2006 | Basceri et al. | |
| 2007/0068449 | A1 | 3/2007 | Seo et al. | |
| 2008/0190355 | A1* | 8/2008 | Chen et al. | 117/3 |

FOREIGN PATENT DOCUMENTS

| CN | 1592949 A | 3/2005 |
| CN | 1695253 A | 11/2005 |
| CN | 1985029 A | 6/2007 |
| CN | 101724893 A | 6/2010 |
| EP | 1 772 539 A1 | 4/2007 |
| JP | 2002-284599 | 10/2002 |
| JP | 2005-008472 | 1/2005 |
| JP | 2010-077023 | 4/2010 |
| WO | WO 03/038868 A2 | 5/2003 |
| WO | WO 2006/017074 A2 | 2/2006 |

OTHER PUBLICATIONS

Nakamura et al., "Ultrahigh-quality silicon carbide single crystals", Nature, vol. 430, 2004, pp. 1009-1012.*
Mitchel, W.C. et al. 2007 "Vanadium donor and acceptor levels in semi-insulating 4H- and 6H-SiC" *Journal of Applied Physics* 101(1): in 7 pages.
Supplementary European Search Report for European Application EP 11 85 4144 dated Apr. 23, 2014, in 14 pages.
Office Action in corresponding Japanese Application No. 2013-516994, dated Dec. 17, 2013.
Ha, et al., "Dislocation conversion in 4H silicon carbide epitaxy," Journal of Crystal Growth 244 (2002) p. 257-266.

* cited by examiner

SEMI-INSULATING SILICON CARBIDE MONOCRYSTAL AND METHOD OF GROWING THE SAME

TECHNICAL FIELD

The present disclosure relates to manufacture and applications of silicon carbide monocrystal, and particularly, to semi-insulating silicon carbide monocrystal and a method of growing the same.

BACKGROUND

The silicon carbide (SiC) material has promising applications in high temperature, high frequency, high power, photoelectronics, and anti-radiation and the like fields, due to its advantages such as wide band-gap, high critical break-down electric field strength, high thermal conductivity, and high carrier saturation mobility velocity. Especially, semi-insulating SiC monocrystal substrates have a wide range of applications in microwave devices. For example, SiC-based microwave devices, such as transistors, manufactured on the semi-insulating SiC monocrystal substrates can produce at a frequency of 10 GHz power density five times greater than that of GaAs-based microwave devices. However, the high-performance SiC-based microwave devices require high crystallization quality of the semi-insulating SiC monocrystal substrates. Here, "semi-insulating" refers to a resistivity greater than $10^5$ Ω·cm at the room temperature, and thus is conceptually similar to "high resistivity" in this context.

In theory, intrinsic SiC crystal exhibits the semi-insulating characteristic due to its wide band gap. However, a SiC crystal without intentional doping during growth thereof may have a resistivity of about 0.1-1000 Ω·cm because of impurities such as N and B in the raw SiC material, impurities such as B and Al in the graphite crucible and the thermal insulation, and impurities such as N impurities remaining in ambient environment. Here, we define these unintentional introduced impurities as "intrinsic impurities". A wafer having such a resistivity range cannot satisfy the requirement for manufacturing the microwave devices.

At present, the semi-insulating SiC crystal with a resistivity greater than $10^5$ Ω·cm is obtained generally by forming a deep energy level in the forbidden band of SiC. The principle underlying this approach is that the resistivity of the material can be improved by introducing the deep energy level into the forbidden band of SiC as a compensation center to capture free carriers. Here, the "deep energy level" refers to an energy level distant from an edge of a valance band or a conduction band by 300 meV or more. However, some elements, such as boron, will also create a shallow energy level. Specifically, the shallow energy level enhances the conductivity of the material, instead of improving the resistivity of the crystal.

More specifically, the approach described above may be implemented in two ways. One way is to introduce point defects to generate a deep energy level to compensate the shallow energy level, so as to achieve the semi-insulating SiC crystal. For example, U.S. Pat. No. 6,218,680 discloses a technique of compensating shallow energy level donor impurities and shallow energy level acceptor impurities with intrinsic point defects. This technique emphasizes that the concentration of heavy metal or transition metal should be as small as possible so as not to impact electric performances of the devices. Especially, the content of vanadium should be smaller than $10^{14}$ cm$^{-3}$ or the detection limit of the secondary ion mass spectrometer. However, it is still unknown how to effectively increase or reduce the concentration of the point defects in the crystal. In practice, the concentration of the point defects in the SiC crystal may be insufficient to compensate the shallow energy level impurities so as to achieve the semi-insulating characteristic required by the microwave devices. Further, some of the point defects may be thermodynamically instable. As a result, the semi-insulating characteristic of the SiC crystal cannot be guaranteed in some special environments. For example, researches show that Si vacancies in the SiC crystal will close up after undergoing high temperature annealing for a relatively long period. As a result, the resistivity of the SiC crystal is reduced, and thus it is impossible to achieve the SiC crystal with the stable semi-insulating characteristic.

The other way is to introduce deep energy level dopants. For example, U.S. Pat. No. 5,611,955 discloses a technique of doping the SiC crystal with a transition element, especially vanadium, as the deep energy level dopants to compensate unintentionally doped impurities such as N and B in the SiC crystal, so as to achieve the semi-insulating SiC crystal. However, introduction of the transition element as the deep energy level dopants into the SiC crystal to achieve the semi-insulating SiC crystal will cause some disadvantages. For example, in case where vanadium is introduced as the deep energy level dopants into the SiC crystal, excessive vanadium will also cause crystal defects. If vanadium has a concentration greater than its solid solubility limit ($5 \times 10^{17}$ cm$^{-3}$) in the SiC crystal, educts of vanadium and micropipes will be produced, which deteriorates the crystal quality. On the other hand, the excessive amount of doped vanadium will reduce mobility of electrons in the crystal, which impacts the performances of the microwave devices manufactured therefrom.

SUMMARY

The present disclosure aims to provide, among others, a semi-insulating SiC monocrystal and a method of growing the same. The semi-insulating SiC monocrystal comprises both deep energy level dopants and intrinsic point defects to compensate for shallow energy level intrinsic impurities, so as to achieve a stable semi-insulating characteristic and a good crystal quality. In this way, the semi-insulating SiC monocrystal according to the present disclosure can meet requirements on high-quality semi-insulating SiC monocrystal substrates for high-performance microwave devices.

The above object can be achieved by techniques described in this disclosure.

According to an aspect of the present disclosure, there is provided a semi-insulating silicon carbide monocrystal, comprising intrinsic impurities, deep energy level dopants and intrinsic point defects. The intrinsic impurities are introduced unintentionally during manufacture of the silicon carbide monocrystal, and the deep energy level dopants and the intrinsic point defects are doped or introduced intentionally to compensate for the intrinsic impurities. The intrinsic impurities include shallow energy level donor impurities and shallow energy level acceptor impurities. A sum of a concentration of the deep energy level dopants and a concentration of the intrinsic point defects is greater than a difference between a concentration of the shallow energy level donor impurities and a concentration of the shallow energy level acceptor impurities, and the concentration of the intrinsic point defects is sufficient for affecting resistivity of the monocrystal and is less than the concentration of the deep energy level dopants.

According to a further aspect of the present disclosure, there is provided a method of growing a semi-insulating silicon carbide monocrystal, comprising: placing SiC powder doped with deep energy level dopants as a raw material into a crucible, covering the crucible with a graphite lid to which seed crystal is attached, and loading the crucible into a crystal growing furnace in such a manner that the SiC powder is positioned in a high temperature region while the seed crystal is positioned in a low temperature region; heating the crucible to deposit vapors, resulting from sublimation and decomposition of the raw material in the high temperature region, on the seed crystal in the low temperature region to form a SiC monocrystal; and cooling the crystal to room temperature.

According to a still further aspect of the present disclosure, there is provided a transistor comprising a substrate made from the semi-insulating silicon carbide monocrystal. The transistor may be any one of a Metal Semiconductor Field Effect Transistor, a Metal Insulator Field Effect Transistor, and a High Electron Mobility Transistor.

According to some embodiments of the present disclosure, the techniques disclosed herein may provide the following advantages.

According to the semi-insulating silicon carbide monocrystal and the method of growing the same disclosed herein, the sum of the concentration of the deep energy level dopants and the concentration of the intrinsic point defects is greater than the difference between the concentration of the shallow energy level donor impurities and the concentration of the shallow energy level acceptor impurities. Therefore, it is possible to achieve sufficient compensation to obtain semi-insulating SiC crystals.

According to the semi-insulating silicon carbide monocrystal and the method of growing the same disclosed herein, both the deep energy level dopants and the intrinsic point defects are introduced to compensate the shallow energy level intrinsic impurities, to achieve a stable semi-insulating characteristic and a good crystal quality, so as to provide high-quality semi-insulating SiC monocrystal substrates required by high-performance microwave devices. Specifically, on one hand, it is possible to reduce difficulties in achieving the semi-insulating characteristic by using two kinds of deep energy level components for compensation. On the other hand, it is possible to avoid degradation of the crystal quality which would occur if only deep energy level dopants are used and thus have an excessive concentration.

According to the semi-insulating silicon carbide monocrystal and the method of growing the same disclosed herein, the concentration of the intrinsic point defects may be sufficient for affecting resistivity of the monocrystal and meanwhile less than the concentration of the deep energy level dopants. Thus, the deep energy level dopants play a dominant role in compensation. As a result, it is possible to avoid instability in resistivity of the SiC wafer which would occur if the intrinsic point defects have a relatively great concentration and thus play a dominant role in the compensation.

There has not been an effective way for increasing or decreasing the point defects in a crystal in the prior art. The SiC monocrystal grown by existing processes may have a point defect concentration with a large variance. It is difficult to maintain a constant concentration for a crystal during its growth. It is also difficult to achieve the constant concentration for different crystals. The resistivity of the SiC monocrystal is unstable when the intrinsic point defects are dominant in compensation and thus such monocrystal is unsuitable for large-scale production.

Also, those skilled in the art will understand that the semi-insulating silicon carbide monocrystal may have to be subjected to subsequent processes, such as high-temperature vapor epitaxy and device manufacture, in order to achieve finished microwave devices, in which processes an ambient temperature may be up to 1400° C.-1700° C. However, some of the point defects are instable in this temperature range, and thus a portion of the point defects will close up, resulting in a reduced resistivity. As a result, it is impossible to achieve the desired semi-insulating characteristic. This will impact performances of the finished microwave devices.

In the method of growing the semi-insulating SiC monocrystal disclosed herein, during the cooling procedure, the monocrystal may be cooled from 1800° C. to the room temperature at a sufficiently slow rate—less than 50° C./h. This will significantly reduce the concentration of such instable point defects. Thus, it is possible to achieve the point defects with good thermal stability and to keep the resistivity of the monocrystal stable in its use.

According to the semi-insulating silicon carbide monocrystal and the method of growing the same disclosed herein, the semi-insulating silicon carbide monocrystal may have on its surface etching pits with a density less than $1000/cm^2$, and thus have a good crystallization quality. Therefore, it is possible to provide high-quality semi-insulating SiC monocrystal required by the high-performance microwave devices.

Crystal defects consist of point defects, line defects, plane defects, and volume defects. For the silicon carbide monocrystal, the line defects may include screw dislocations, edge dislocations and the like, the plane defects may include base-plane dislocations and the like, and the volume defects may include polytypes, micropipes and the like. The point defects at a low concentration help to realize the insulating characteristic of the crystal while having a negligible impact on the crystallization quality. Most of the other defects have heredity and thus tend to propagate to an epitaxial layer in subsequent vapor epitaxy. This will significantly degrade the performances of the subsequently manufactured microwave devices. Because those defects will all present etching pits, which may have different shapes, after molten KOH etching, in this context a density of the defects in the crystal is denoted by a density of the etching pits on the surface. According to the present disclosure, the etching pits on the surface of the semi-insulating monocrystal may have a density less than $1000/cm^2$ and thus have a good crystallization quality. This can satisfy the requirements in subsequent manufacture of the devices.

BRIEF DESCRIPTION OF THE DRAWINGS

Embodiments of the present disclosure will be further described with reference to attached drawings, in which.

DETAILED DESCRIPTION

Figure 1:
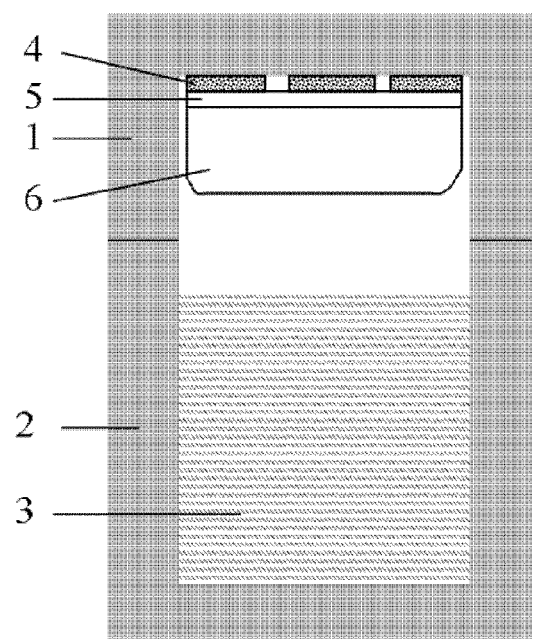
FIG. 1 is a structural view schematically showing a growth chamber for growing a SiC monocrystal by a physical vapor transport method according to an embodiment of the present disclosure.

According to an embodiment of the present disclosure, there is provided a semi-insulating SiC monocrystal, comprising intrinsic impurities, deep energy level dopants and intrinsic point defects. The intrinsic impurities are introduced unintentionally during manufacture of the silicon carbide monocrystal, and include shallow energy level donor impurities and shallow energy level acceptor impurities. The deep energy level dopants and the intrinsic point defects are doped or introduced intentionally to compensate for the intrinsic impurities.

A sum of a concentration of the deep energy level dopants and a concentration of the intrinsic point defects is greater than a difference between a concentration of the shallow energy level donor impurities and a concentration of the shallow energy level acceptor impurities, so as to achieve the compensation. The concentration of the intrinsic point defects may be greater than $1 \times 10^{15}$ cm$^{-3}$, in order to significantly affect the resistivity of the silicon carbide crystal. Further, the concentration of the intrinsic point defects is less than the concentration of the deep energy level dopants, so that the deep energy level dopants play a dominant role in the compensation. As a result, it is possible to avoid instability in the resistivity of the SiC wafer which would occur if the intrinsic point defects have an excessive concentration and thus play a dominant role in the compensation.

Because the shallow energy level donor impurities and the shallow energy level acceptor impurities are unintentionally introduced, their concentrations should controlled to be sufficiently low, for example, the difference between their concentrations should be lower than $5 \times 10^{17}$ cm$^{-3}$, preferably, lower than $5 \times 10^{16}$ cm$^{-3}$, during the growth process of the crystal. Further, although in some embodiments the shallow energy level donor impurities in the silicon carbide monocrystal are described as comprising nitrogen and the shallow energy level acceptor impurities are described as comprising boron and aluminum, there can be other intrinsic impurities introduced in manufacture processes, which all fall into the scope of the present disclosure.

According to a further embodiment of the present disclosure, the deep energy level dopants may comprise any other element selected from groups IIIB, IVB, VB, VIB, VIIB, VIIIB, IB, and IIB in the periodic table of elements, or any combination thereof. For example, elements from groups IVB and VB, preferably, vanadium and titanium, are used to achieve a resistivity of the silicon carbide monocrystal at the room temperature greater than $1 \times 10^5$ Ω·cm, preferably, greater than $1 \times 10^9$ Ω·cm. Further, the resistivity of the silicon carbide monocrystal at the room temperature can vary no greater than 10% after annealing at 1800° C. for a long period.

Although in some embodiments the intrinsic point defects are described as comprising carbon vacancies ($V_C$) and dual-vacancies of silicon and carbon, there can be other intrinsic point defects, for example, any one of silicon vacancies ($V_{Si}$), a combination of carbon vacancies and substitutions, a combination of silicon vacancies and substitutions, dual-vacancies such as dual-carbon-vacancies and dual-silicon-vacancies, and complex point defects such as clusters of triple-vacancies.

According to a further embodiment of the present disclosure, there is provided a method of growing a semi-insulating SiC monocrystal, the method comprising:

(1) loading SiC powder doped with deep energy level dopants as a raw material into a crucible, coving the crucible with a graphite lid to which seed crystal is attached, and placing the crucible into a crystal growth furnace in such a manner that the SiC powder is positioned in a high temperature region of the crystal growth furnace while the seed crystal is positioned in a low temperature region of the crystal growth furnace;

(2) heating the crucible to deposit vapor sources, resulting from sublimation and decomposition of the raw material in the high temperature region, on the seed crystal in the low temperature region to form a SiC monocrystal; and (3) cooling the SiC monocrystal to room temperature.

During the growth process, a temperature, a vapor ratio of silicon to carbon and a crystal growth rate at a crystal growth interface can be maintained substantially constant, while reducing the amount of the intrinsic impurities into the grown crystal. As a result, it is possible to achieve the semi-insulating SiC crystal with a high quality.

According to an embodiment, the deep energy level dopants are mixed in the second phase with the raw SiC material uniformly to produce the SiC powder doped with the deep energy level dopants. Alternatively, the deep energy level dopants can be diffused into crystal lattices of the raw SiC material to produce the SiC powder doped with the deep energy level dopants. The diffusion of the deep energy level dopants into the crystal lattices of the raw SiC material ensures that the concentration of the deep energy level dopants can keep substantially stable during the entire growth process, without causing non-uniformity of the deep energy level dopants in the grown crystal.

As is well known in the art, generally it is desired that crystal growth takes place under stable conditions with small fluctuations. However, during the growth process of the silicon carbide crystal, the vaporized resultants from the sublimation of the raw material of SiC in the high temperature region are not in a stoichiometric ratio. Specifically, a vapor ratio of silicon to carbon is generally greater than 1. The graphite crucible is porous and has deteriorating impermeability at a high temperature. As the growth process proceeds, the vapor of silicon gradually leaks from the crucible, and the raw material begins to being graphitized. Specifically, for a single particle in the powder, it is wrapped by a layer of remaining graphite in its outer surface. Therefore, the vapor ratio of silicon to carbon varies, and more specifically, gradually declines during the growth process. The reduction of the vapor ratio of silicon to carbon tends to cause defects, such as inclusions and polytypes, in the crystal, resulting in a significantly degraded crystallization quality. Furthermore, generation of the point defects in the SiC monocrystal is closely associated with the growth process of the monocrystal. The concentration of the point defects may be affected by the crystallization temperature, vapor ratio of silicon to carbon, and growth rate at the crystal growth interface. The type and concentration of the crystal points defects may be varied according to the ratio of silicon to carbon in the growth atmosphere. Thus, it is difficult to obtain a stable resistivity of the semi-insulating SiC monocrystal. To address this problem, according to the embodiment, the temperature, the vapor ratio of silicon to carbon and the crystal growth rate at the crystal growth interface can be maintained substantially constant. For example, maintaining the vapor ratio of silicon to carbon and the crystal growth rate at the crystal growth interface can be achieved by gradually lowering the temperature of the raw material in the high temperature region, while gradually lowering the pressure of the growth atmosphere during the growth process. As the temperature for sublimation becomes lower, the vapor ratio of silicon to carbon from the sublimation of the raw material of SiC becomes greater, compensating the decrease of the ratio of silicon to carbon in conventional growth conditions. At the same time, the supplied vapor sources become less due to the decrease of sublimation temperature so that the crystallization rate becomes lower, which is compensated by gradual decrease of pressure of the growth atmosphere. Therefore, lowering the temperature of the raw material and lowering the pressure of the growth atmosphere in combination make the vapor ratio of silicon to carbon and the crystal growth rate stable at the crystal growth interface, so as to ensure a high crystallization quality and a stable semi-insulating resistivity.

According to an advantageous example, in order to maintain the vapor ratio of silicon to carbon and the crystal growth rate at the crystal growth interface, during the growth process, the temperature of the raw material in the high temperature region is lowered by 30-300° C. and the pressure of the growth atmosphere is lowered by 5%-90% of an original pressure.

According to an example, the vapor ratio of silicon to carbon at the crystal growth interface can be maintained substantially constant by introducing a vapor organic carbon source and controlling a flow rate of the vapor organic carbon source in real time during the growth process. The amount of the intrinsic impurities into the grown crystal can be reduced by introducing the vaporized organic carbon source during the growth process. The vapor organic carbon source may comprise methane, ethane, propane, or acetylene.

During the growth process of the silicon carbide crystal, nitrogen included in the growth atmosphere tends to replace carbon. Thus, there is competition between the vaporized carbon and the nitrogen at the interface. If the vapor organic carbon source is introduced, it is will be more difficult for the nitrogen to enter the crystal, whereby reducing the concentration of the intrinsic impurities and enhancing the resistivity of the semi-insulating crystal.

During the growth process, the SiC monocrystal can be grown in a non-thermodynamic-equilibrium condition and the crystallization rate of the SiC monocrystal may reach a critical rate. As a result, the concentration of grown-in point defects in the SiC monocrystal is greater than that in a SiC monocrystal grown in a near thermodynamic equilibrium condition. The critical rate may be in a range of 1 mm/h-4 mm/h, and preferably, 1.5-4 mm/h. The growth of the silicon carbide crystal in the non-thermodynamic-equilibrium condition can be implemented by maintaining a low crystallization temperature at the crystal growth interface, a high temperature at the raw material of SiC, and/or a low pressure inside the growth chamber.

During the cooling operation, the crystal may be cooled from 1800° C. to the room temperature at a sufficiently slow rate, to reduce the concentration of instable point defects so as to ensure that the crystal has a stable resistivity in its use. For example, the cooling rate can be—less than 50° C./h. According to an advantageous example, the cooling rate is less in a high temperature region than in a low temperature region.

Hereinafter, some examples of the present disclosure will be described in detail. The descriptions of those examples will explain how to achieve the semi-insulating characteristic of the high-quality semi-insulating SiC monocrystal by compensating the shallow energy levels of the donor and acceptor impurities by both the dominant deep energy level dopants and the intrinsic point defects. These examples also explain how to achieve a stable semi-insulating characteristic and a good crystal quality by compensating the shallow energy levels of the intrinsic impurities by both the deep energy level dopants and the intrinsic point defects, whereby providing high-quality semi-insulating SiC monocrystal substrates required by high-performance microwave devices.

In the following examples, all SiC crystals are made in a growth chamber as shown in FIG. 1 by a commonly used SiC crystal manufacturing method, i.e., Physical Vapor Transport (PVT). For example, the PVT method can be performed as follows. A graphite crucible 2 can be heated so that a temperature inside it can be increased to 2000-2400° C. and thus a raw SiC material 3 can sublimate, resulting in vaporized $Si_2C$, $SiC_2$ and Si. A seed crystal 5 is disposed atop the crucible which is lower in temperature than the raw SiC material 3 (here the reference number "4" indicates an adhesive). The vaporized materials produced from the sublimation are transported to the seed crystal 5, which has the relatively lower temperature, from a surface of the raw material due to a temperature gradient, and crystallize on the seed crystal to form a bulk SiC crystal 6.

For more details of apparatuses for growing the SiC crystal and the PVT method, reference may be made to Chinese Patent No. ZL 200310113521.X, entitled "Apparatus for Growing Silicon Carbide Crystal," which has been allowed on Mar. 29, 2006, and also Chinese Patent No. ZL 200310113523.9, entitled "Method and Apparatus for Growing Silicon Carbide Monocrystal by Physical Vapor Transport," which has been allowed on Jun. 28, 2006. It is to be understood by those skilled in the art that the SiC monocrystal according to the present disclosure can be grown by other methods such as High Temperature Chemical Vapor Deposition (HTCVD), liquid phase methods and the like. The methods described in the present disclosure are provided just for illustration. Further, according to some embodiments of the present disclosure, the graphite crucible and a heat insulating material are subjected to purification. For example, the graphite crucible and the heat insulating material can be heated to a high temperature of 2000° C. in an atmosphere of Ar, to make impurities included therein, such as aluminum and boron, to volatilize sufficiently. In this way, it is possible to reduce impacts of the intrinsic impurities on the resistivity of the SiC crystal as much as possible.

Example 1

In this example, Crystal 1 is intentionally doped with a deep energy level dopant, e.g., vanadium. For example, Crystal 1 can be manufactured as follows. First, 80 mg of vanadium carbide powder (with a purity of 99.999%) may be added to 700 g of silicon powder (with a purity of 99.999%) and 300 g carbon powder (with a purity of 99.999%). Then, they are mixed sufficiently uniformly by a ball mill, and then are subjected to solid-phase reaction at a high temperature of 2200° C. to produce doped SiC powder. Referring to FIG. 1, the SiC powder is placed as the raw material 3 into the graphite crucible 2, and the crucible 2 is covered with a crucible lid 1, to which a seed crystal 5 of 4H—SiC is attached. Then, the crucible covered with the crucible lid is placed into a crystal growth furnace. A mixed gas of argon and methane is filled into the growth furnace, and has its pressure controlled at about 2000 Pa, wherein methane constitutes 40% of the mixed gas. The seed crystal has its temperature maintained at 2000-2150° C., while the raw material has its temperature maintained at 2250-2400° C. During the growth process, the proportion of the methane gas can be gradually reduced to maintain the ratio of silicon to carbon substantially constant at the growth interface. Further, positions of the crucible and the graphite cover relative to each other can be controlled to maintain a substantially constant temperature and growth rate at the growth interface. In this way, it is possible to grow the SiC crystal in a high quality. The crystal growth rate is about 1.2 mm/h. The resultant crystal is cooled to the room temperature. Generation and control of the point defects can be achieved by the crystal growth process and annealing process. For example, the point defects can be introduced by crystallization and growth in a non-thermodynamic-equilibrium condition at the growth rate of 1.2 mm/h. Further, the crystal can be cooled from 1900° C. to the room temperature in 80 hours in such a manner that the cooling rate increases exponentially as the temperature decreases. In this way, it is possible to reduce the concentration of instable point defects in the crystal, and thus to achieve the stability of the resistivity of the crystal.

Crystal 2 has no intentionally doped deep energy level dopant. Other aspects of Crystal 2 in terms of growth and annealing can be the same as those of Crystal 1, and thus detailed descriptions thereof are omitted here.

Crystal 1 and Crystal 2 of SiC obtained as described above can be sliced in a direction perpendicular to the growth direction, to produce Wafer 1 and Wafer 2 with a thickness of 0.4 mm, respectively. The wafers are in middle portions of the respective crystals, for example, about 5 mm distant from the seed crystal. Those two wafers are characterized for assessment of their performances.

Figure 2:
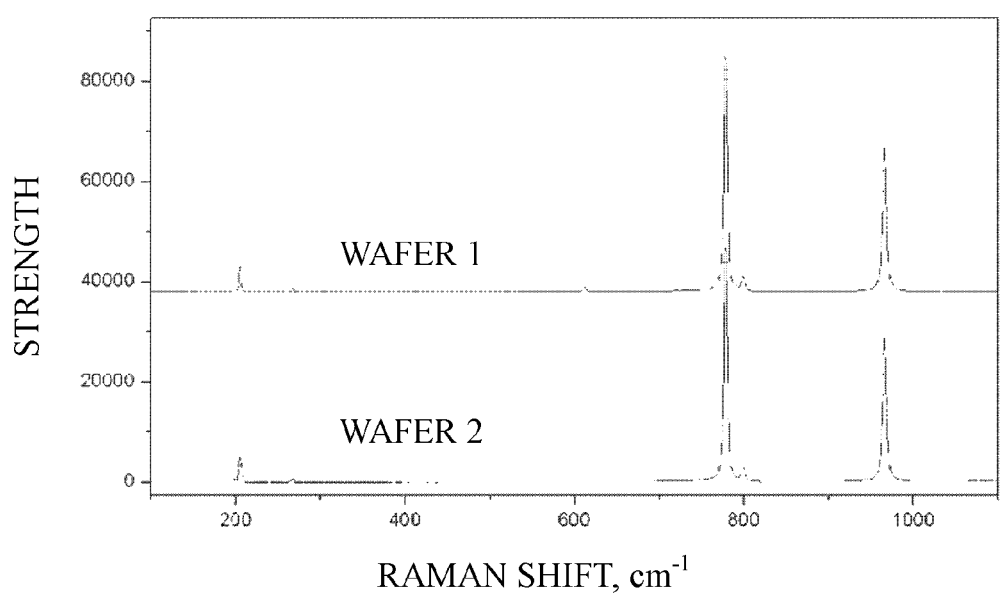
FIG. 2 shows Raman spectrograms of Wafer 1 and Wafer 2 in Example 1 of the present disclosure.

Raman spectrograms of Wafer 1 and Wafer 2 are shown in FIG. 2, indicating that Wafer 1 and Wafer 2 are of 4H—SiC crystal type. Wafer 1 has an average resistivity of $6.9 \times 10^8$ Ω·cm, and Wafer 2 has an average resistivity of $8.4 \times 10^3$ Ω·cm, which are measured by contactless resistance instruments. Further, Wafer 1 can be subjected to annealing at a high temperature of 1800° C. in a protective atmosphere of Ar at 50 kPa for 10 hours. After the annealing, the resistivity of Wafer 1 becomes $6.8 \times 10^8$ Ω·cm, and thus varies by only 1.5%. This shows that the resistivity exhibits no significant variation after the annealing and that the semi-insulating characteristic of the wafer has a good stability.

Contents of impurities in Wafer 1 and Wafer 2 can be characterized by secondary ion mass spectra, as shown in Table 1. Crystal 1 and Crystal 2 both include shallow energy level donor impurities of nitrogen (N), shallow energy level acceptor impurities of boron (B) and aluminum (Al), and also deep energy level dopants of vanadium (V), with other impurities of a negligible content. Table 1 shows that the two crystals have intrinsic impurities similar to each other in concentration. Further, in Wafer 1 the concentration (2.5E+16) of the deep energy level dopants is slightly less than a difference (3.4E+16) between the concentration of the shallow energy level donor impurities and the concentration of the shallow energy level acceptor impurities. That is, in Crystal 1 the deep energy level dopants alone are insufficient to compensate the shallow energy level impurities to achieve the semi-insulating characteristic.

TABLE 1

Contents of Impurities in SiC Wafers (in $cm^{-3}$)

| Sample | N | B | Al | V |
|---|---|---|---|---|
| Wafer 1 | 9.1E+16 | 5.6E+16 | 1.3E+15 | 2.5E+16 |
| Wafer 2 | 9.3E+16 | 5.8E+16 | 2.5E+15 | 3.2E+14 |

Further, the wafers are characterized by positron annihilation lifetime spectra. Results show that: for Wafer 1, $\tau 1=138$ ps, and $\tau 2=166$ ps; and for Wafer 2, $\tau 1=133$ ps, and $\tau 2=158$ ps. There are no significant differences between those two wafers. As indicated by experimental results and theoretical calculations which have already been reported, 138 ps and 133 ps correspond to the bulk lifetime of the SiC crystal, and 166 ps and 158 ps correspond to point defects of carbon vacancies (VC) or dual-carbon-vacancies in the SiC crystal. This shows that there are almost the same point defects in the two crystals.

Figure 3:
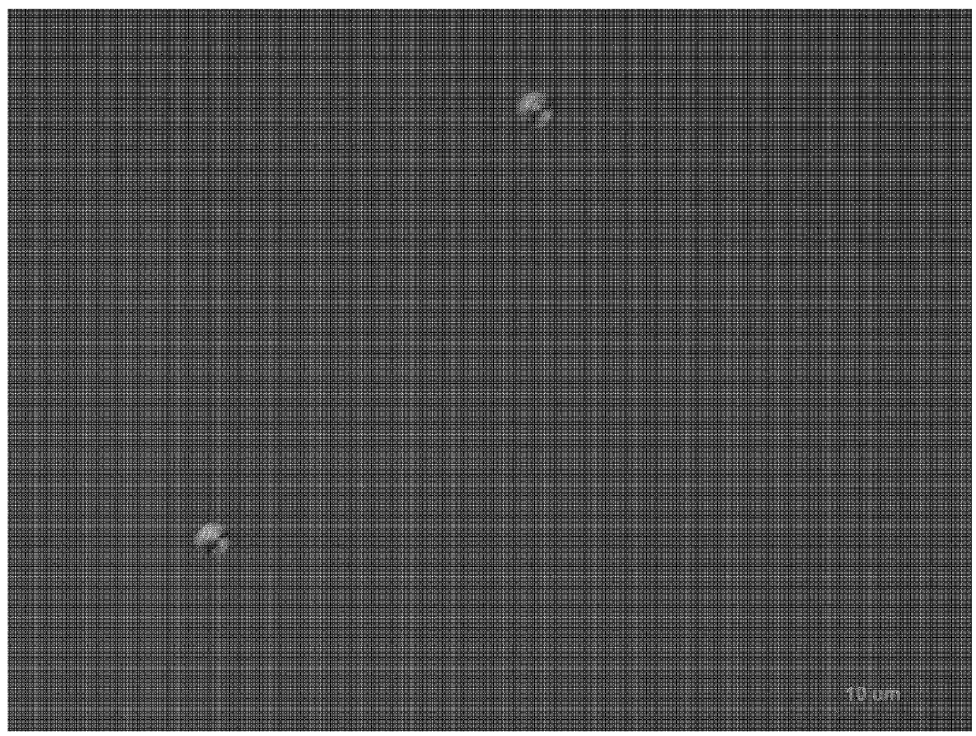
FIG. 3 shows a morphology of etching pits on a surface of a silicon carbide wafer after being etched by KOH.

Furthermore, Wafer 1 can be etched by melt KOH at a surface of (0001), oriented to <11-20> shifted by 4 degrees, at an etching temperature of 480° C. for 10 minutes. The etched surface can be observed by an optical microscope in its 100× mode. As shown in FIG. 3, etching pits are calculated to have a density of 850/$cm^2$. This shows that the crystal has a good crystallization quality.

From the above results, it can be seen that in Wafer 2 the presence of only the point defects is insufficient to compensate the shallow energy levels, though it indeed affects the resistivity. As a result, the resistivity of Wafer 2 does not meet the requirement of "semi-insulating." From the comparison between Wafer 1 and Wafer 2, it can be seen that the resistivity of Wafer 1 is greater by 5 orders of magnitude than that of Wafer 2. That is, the enhancement of the resistivity is much greater than the resistivity of Wafer 2 itself. This shows that the deep energy level dopants play a dominant role in the compensation. In Wafer 1, the concentration of the point defects is less than that of the deep energy level dopant. Therefore, the semi-insulating characteristic of Wafer 1 results from the compensation of both the dominant deep energy level dopants and the intrinsic point defects for the shallow energy level acceptor and donor impurities.

Example 2

In this example, SiC crystals are manufactured in the same manner as in Example 1. Further, in this example, the graphite crucible and the heat insulating material are also subjected to purification. For example, the graphite crucible and the heat insulating material can be heated to a high temperature of 2000° C. in an atmosphere of Ar, to make impurities included therein, such as aluminum and boron, to volatilize sufficiently. In this way, it is possible to reduce impacts of the intrinsic impurities on the resistivity of the SiC crystal as much as possible.

In this example, Crystal 3 comprises a combination of vanadium and titanium as deep energy level dopants. For example, Crystal 3 can be manufactured as follows. First, 200 mg of vanadium carbide powder (with a purity of 99.999%) and 90 mg of titanium carbide powder (with a purity of 99.999%) may be added to 800 g of silicon carbide powder (with a purity of 99.999%). Then, they are mixed sufficiently uniformly by a ball mill, and then are placed as the raw material 3 into the graphite crucible 2 as shown in FIG. 1. The crucible 2 is covered with the crucible cover 1, to which a seed crystal 5 of 6H—SiC is attached. The crucible covered with the crucible cover is placed into a crystal growth furnace. Ar is filled into the growth furnace, and has its pressure controlled at about 1500 Pa-500 Pa. The raw material has its temperature maintained at 2250-2400° C., while the seed crystal has its temperature maintained at 2050-2200° C. During the growth process, positions of the crucible and the graphite cover relative to each other can be controlled to maintain temperature constant at the growth interface. Further, the pressure can be reduced and also the temperature of the raw material can be reduced to maintain a vapor ratio of silicon to carbon and a growth rate substantially constant at the growth interface. In this way, it is possible to grow the SiC crystal with a high quality. The crystal growth rate is about 1.8 mm/h. Control of the point defects in the crystal can be achieved by an annealing process. For example, the crystal can be cooled from the growth temperature to 1800° C. to in 2 hours, and then to the room temperature in 40 hours.

Crystal 4 has no intentionally doped deep energy level dopants. Other aspects of Crystal 4 in terms of growth and annealing can be the same as those of Crystal 3, and thus detailed descriptions thereof are omitted here.

Crystal 3 and Crystal 4 of SiC obtained as described above can be sliced in a direction perpendicular to the growth direction, to produce Wafer 3 and Wafer 4 with a thickness of 0.4 mm, respectively. The wafers can be middle portions of the respective crystals, for example, about 8 mm distant from the seed crystal. Those two wafers are tested for assessment of their performances.

Figure 4:
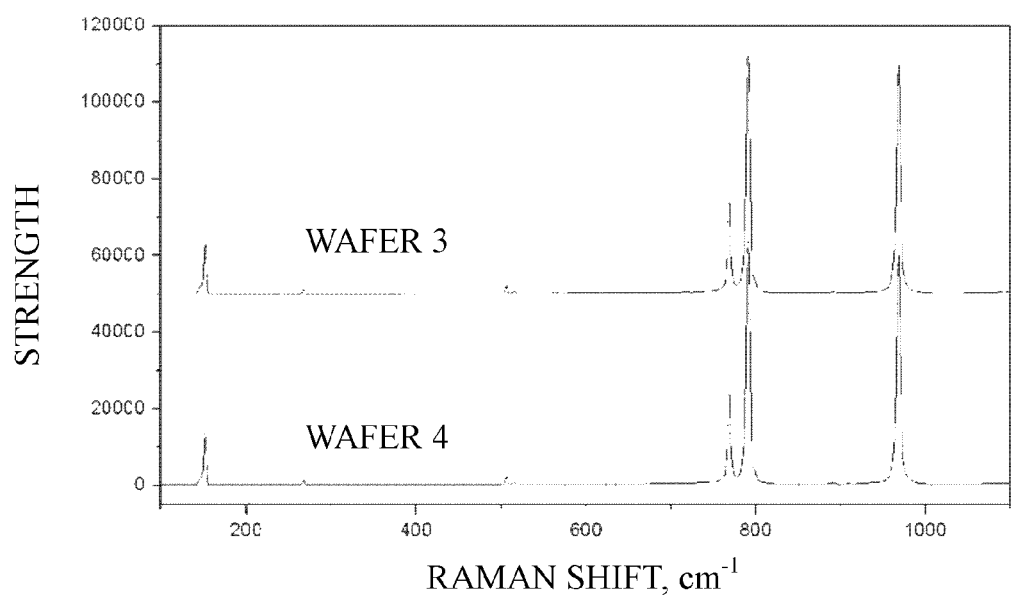
FIG. 4 shows Raman spectrograms of Wafer 3 and Wafer 4 in Example 2 of the present disclosure.

Raman spectrograms of Wafer 3 and Wafer 4 are shown in FIG. 4, indicating that Wafer 3 and Wafer 4 have a crystal type of 6H—SiC. Wafer 3 has a resistivity of $3.9 \times 10^9$ $\Omega \cdot cm$, and Wafer 4 has a resistivity of $4.6 \times 10^3$ $\Omega \cdot cm$, which are measured by contactless resistance instruments.

Contents of impurities in the wafers can be characterized by secondary ion mass spectra, as shown in Table 2. Other impurities than those shown in the table are in a negligible content. In Wafer 3, the concentration (1.1E+17) of the deep energy level dopants is slightly less than a difference (1.4E+17) between the concentration of the shallow energy level donor impurities and the concentration of the shallow energy level acceptor impurities. That is, in Crystal 3 the deep energy level dopants alone are insufficient to compensate the shallow energy levels to achieve the semi-insulating characteristic.

TABLE 2

Contents of Impurities in SiC Wafers (in $cm^{-3}$)

| Sample | N | B | Al | V | Ti |
|---|---|---|---|---|---|
| Wafer 3 | 1.9E+17 | 4.7E+16 | 2.2E+15 | 7.8E+16 | 3.3E+16 |
| Wafer 4 | 1.9E+17 | 4.6E+16 | 2.8E+15 | 8.3E+13 | 2.1E+13 |

Further, the wafers are characterized by positron annihilation lifetime spectra. Results show that: for Wafer 3, $\tau 1 = 131$ ps, and $\tau 2 = 220$ ps; and for Wafer 4, $\tau 1 = 133$ ps, and $\tau 2 = 222$ ps. There are no significant differences between those two wafers. As indicated by experimental results and theoretical calculations which have already been reported, 131 ps and 133 ps correspond to a bulk lifetime of the SiC crystal, and 220 ps and 222 ps correspond to point defects of dual-silicon-and-carbon-vacancies ($V_{Si}V_C$) in the SiC crystal.

From the above results of Wafer 4, it can be seen that the presence of only the point defects is insufficient to compensate the shallow energy levels, though it indeed affects the resistivity. As a result, the resistivity of Wafer 4 does not meet the requirement of "semi-insulating." From the comparison between Wafer 3 and Wafer 4, it can be seen that the resistivity of Wafer 3 is greater by 6 orders in magnitude than that of Wafer 4. That is, the enhancement of the resistivity is much greater than the resistivity of Wafer 4 itself. This shows that in wafer 3 the concentration of the point defects is less than that of the deep energy level dopants and thus the deep energy level dopants plays a dominant role in the compensation. Therefore, the semi-insulating characteristic of Wafer 3 results from the compensation of both the deep energy level dopants which is dominant and the intrinsic point defects for the shallow energy level acceptor and donor impurities.

Further, Crystal 5 is grown in the same manner as Wafer 4, except that it is cooled, after being grown, from 1800° C. to the room temperature in 5 hours. Crystal 5 of SiC obtained as described above can be diced in a direction perpendicular to the growth direction, to produce Wafer 5 with a thickness of 0.4 mm. The wafer can be a middle portion of the crystal, for example, about 8 mm distant from the seed crystal. Wafer 5 has a resistivity of $2.8 \times 10^5$ $\Omega \cdot cm$, which is measured by a contactless resistance meter.

Furthermore, Wafer 3, Wafer 4 and Wafer 5 of SiC in this example can be subjected to annealing at a high temperature of 1800° C. in a protective atmosphere of Ar at 50 kPa for 30 hours. After the annealing, the resistivity of Wafer 3, Wafer 4, and Wafer 5 becomes $3.8 \times 10^9$ $\Omega \cdot cm$, $4.6 \times 10^3$ $\Omega \cdot cm$, and $8.6 \times 10^3$ $\Omega \cdot cm$, respectively. Comparison between Wafer 4 and Wafer 5 shows that the semi-insulating characteristic originating from only the point defects is instable and will be degraded after the annealing because the resistivity decreases significantly. The results of Wafer 3 show that the crystal manufactured by the method disclosed herein can have its resistivity present no significant variations after the annealing and thus exhibits a good thermal stability of the semi-insulating characteristic.

The above examples show that it is possible to grow a semi-insulating SiC monocrystal with a high quality by compensating intrinsic impurities at shallow energy levels with both the deep energy level dopants which is dominant and intrinsic point defects. That is, the semi-insulating characteristic of the high-quality semi-insulating SiC monocrystal results from the compensation of both the deep energy level dopants which is dominant and the intrinsic point defects for shallow energy level donor impurities and shallow energy level acceptor impurities.

According to a further embodiment, there is provided a transistor comprising the semi-insulating silicon carbide monocrystal as described above as a substrate. For example, the transistor may comprise any one of a Metal Semiconductor Field Effect Transistor, a Metal Insulator Field Effect Transistor, or a High Electron Mobility Transistor.

Concepts and principles of the technology have been explained and illustrated in the above by using some terms. However, it is to be noted that those terms should not be construed as limiting the present disclosure. The embodiments and examples described above are provided only for illustrative purpose. Various changes and modifications to the embodiments are apparent for those skilled in the art, without departing from the spirit and scope of the present disclosure, which are defined by the appended claims.

We claim:

1. A semi-insulating silicon carbide monocrystal, comprising intrinsic impurities, deep energy level dopants and intrinsic point defects,
    wherein the intrinsic impurities are introduced unintentionally during manufacture of the silicon carbide monocrystal, and the deep energy level dopants and the intrinsic point defects are doped or introduced intentionally to compensate for the intrinsic impurities,
    wherein the intrinsic impurities comprise shallow energy level donor impurities and shallow energy level acceptor impurities;
    wherein a sum of a concentration of the deep energy level dopants and a concentration of the intrinsic point defects is greater than a difference between a concentration of the shallow energy level donor impurities and a concentration of the shallow energy level acceptor impurities, and the concentration of the intrinsic point defects is less than the concentration of the deep energy level dopants, and the concentration of the deep energy level dopants is less than the difference between the concentration of the shallow energy level donor impurities and the concentration of the shallow energy level acceptor impurities; and wherein the concentration of the intrinsic point defects is greater than $1\times10^{15}$ cm$^{-3}$.

2. The semi-insulating silicon carbide monocrystal according to claim 1, wherein the deep energy level dopants comprise at least one of elements selected from the group consisting of IIIB, IVB, VB, VIB, VIIB, VIIIB, IB, and IIB in the periodic table of elements.

3. The semi-insulating silicon carbide monocrystal according to claim 2, wherein the deep energy level dopants comprise at least one selected from the group consisting of Scandium, Vanadium, and Titanium.

4. The semi-insulating silicon carbide monocrystal according to claim 1, wherein:

the intrinsic point defects comprise one or more selected from the group consisting of carbon vacancies, silicon vacancies, a combination of carbon vacancies and substitutions, a combination of silicon vacancies and substitutions, dual-vacancies, and complex point defects; and the dual-vacancies comprise dual-carbon-vacancies, dual-silicon-vacancies, or carbon-and-silicon-vacancies, and the complex point defects comprise clusters of triple-vacancies.

5. The semi-insulating silicon carbide monocrystal according to claim 1, wherein:

the shallow energy level donor impurities comprise Nitrogen, and the shallow energy level acceptor impurities comprise Boron or Aluminum;

the difference between the concentration of the shallow energy level donor impurities and the concentration of the shallow energy level acceptor impurities is less than $5\times10^{17}$ cm$^{-3}$; and the semi-insulating silicon carbide monocrystal has a resistivity greater than $1\times10^{5}$ Ω·cm at room temperature.

6. The semi-insulating silicon carbide monocrystal according to claim 5, wherein:

the difference between the concentration of the shallow energy level donor impurities and the concentration of the shallow energy level acceptor impurities is less than $5\times10^{16}$ cm$^{-3}$; and the semi-insulating silicon carbide monocrystal has a resistivity greater than $1\times10^{9}$ Ω·cm at the room temperature.

7. The semi-insulating silicon carbide monocrystal according to claim 1, wherein a resistivity of the semi-insulating silicon carbide monocrystal at room temperature after annealing at 1800° C. varies no greater than 10% compared with a resistivity of the semi-insulating silicon carbide monocrystal at room temperature before the annealing.

8. The semi-insulating silicon carbide monocrystal according to claim 1, wherein etching pits density after molten KOH etching on the semi-insulating silicon carbide monocrystal's surface is less than 1000/cm$^2$.

9. A method of growing a semi-insulating silicon carbide monocrystal according to claim 1, comprising:

loading SiC powder doped with deep energy level dopants as a raw material into a crucible;

covering the crucible with a graphite lid to which seed crystal is attached;

placing the crucible into a crystal growth furnace in such a manner that the SiC powder is positioned in a high temperature region while the seed crystal is positioned in a low temperature region;

heating the crucible to deposit vapor sources resulting from sublimation and decomposition of the raw material in the high temperature region on the seed crystal in the low temperature region to form the SiC monocrystal; and cooling the SiC monocrystal to room temperature.

10. The method according to claim 9, further comprising:

mixing the deep energy level dopants in a second phase with a raw SiC material uniformly to produce the SiC powder doped with the deep energy level dopant; and/or diffusing the deep energy level dopants into crystal lattices of a raw SiC material to produce the SiC powder doped with the deep energy level dopant, without any second phase occurring in the raw material.

11. The method according to claim 9, wherein heating the crucilbe to deposit the vapor sources resulting from sublimation and decomposition of the raw material in the high temperature region on the seed crystal in the low temperature region to grow the SiC monocrystal comprises:

maintaining a temperature, a vapor ratio of silicon to carbon and a crystal growth rate substantially constant at a crystal growth interface, while reducing an amount of the intrinsic impurities entering the grown crystal.

12. The method according to claim 11, wherein maintaining the temperature, the vapor ratio of silicon to carbon and the crystal growth rate substantially constant at the crystal growth interface comprises:

gradually lowering a temperature of the raw material in the high temperature region, while gradually lowering a pressure of a growth atmosphere during the growth process.

13. The method according to claim 12, wherein during the growth process the temperature of the raw material in the high temperature region is gradually lowered by 30-300° C. and the pressure of the growth atmosphere is gradually lowered by 5%-90% of an original pressure.

14. The method according to claim 11, wherein maintaining the vapor ratio of silicon to carbon substantially constant at the crystal growth interface comprises:

introducing a vapor organic carbon source and controlling the flow rate of the vapor organic carbon source in real time during the growth process.

15. The method according to claim 14, wherein the vapor organic carbon source comprises at least one selected from the group consisting of methane, ethane, propane, and acetylene.

16. The method according to claim 11, wherein reducing the amount of the intrinsic impurities entering the grown crystal comprises:

introducing a vapor organic carbon source during the growth process.

17. The method according to claim 11, wherein during the growth process the SiC monocrystal is grown in a non-thermodynamic-equilibrium condition and a crystallization rate of the SiC monocrystal reaches a critical growth rate so that a concentration of point defects in such SiC monocrystal is greater than that in a SiC monocrystal grown in a near thermodynamic equilibrium condition.

18. The method according to claim 17, wherein the critical growth rate is in a range of 1 mm/h-4 mm/h.

19. The method according to claim 9, wherein cooling the SiC monocrystal to the room temperature comprises:

cooling the monocrystal from 1800° C. to the room temperature at a rate of less than 50° C./h, which is sufficiently slow to reduce a concentration of instable point defects so as to ensure that the monocrystal has a stable resistivity in use.

20. A transistor comprising a substrate made from the semi-insulating silicon carbide monocrystal according to claim 1, wherein the transistor comprises at least one selected from the group consisting of a Metal Semiconductor Field Effect Transistor, a Metal Insulator Field Effect Transistor, and a High Electron Mobility Transistor.

\* \* \* \* \*